(12) United States Patent
Zhang et al.

(10) Patent No.: US 9,564,866 B2
(45) Date of Patent: Feb. 7, 2017

(54) METHOD AND DEVICE FOR PRIORITIZING AUDIO DELIVERY IN AN APPLICATION

(71) Applicant: Tencent Technology (Shenzhen) Company Limited, Shenzhen (JP)

(72) Inventors: Weilin Zhang, Shenzhen (CN); Hengxi Luo, Shenzhen (CN); Hongfu Wang, Shenzhen (JP)

(73) Assignee: TENCENT TECHNOLOGY (SHENZHEN) COMPANY LIMITED, Shenzhen, Guangdong Province (CN)

( * ) Notice: Subject to any disclaimer, the term of this patent is extended or adjusted under 35 U.S.C. 154(b) by 58 days.

(21) Appl. No.: 14/685,438

(22) Filed: Apr. 13, 2015

(65) Prior Publication Data

US 2015/0222239 A1    Aug. 6, 2015

Related U.S. Application Data

(63) Continuation of application No. PCT/CN2013/087807, filed on Nov. 26, 2013.

(30) Foreign Application Priority Data

Dec. 25, 2012 (CN) .......................... 2012 1 0572012

(51) Int. Cl.
*H03G 3/20* (2006.01)
*A63F 13/40* (2014.01)
(Continued)

(52) U.S. Cl.
CPC ................. *H03G 3/20* (2013.01); *A63F 13/10* (2013.01); *A63F 13/12* (2013.01); *H04L 65/602* (2013.01); *A63F 2300/6081* (2013.01)

(58) Field of Classification Search
None
See application file for complete search history.

(56) References Cited

U.S. PATENT DOCUMENTS 8,460,090 B1 *  6/2013  Gilliland ............. G07F 17/3262
                                                        463/16
2008/0305857 A1 * 12/2008 Okada ..................... G07F 17/32
                                                        463/25
(Continued)

FOREIGN PATENT DOCUMENTS

CN        1933495 A      3/2007
CN      101098523 A      1/2008
(Continued)

OTHER PUBLICATIONS

Tencent Technology, ISRWO, PCT/CN2013/087807, Feb. 6, 2014, 7 pgs.

(Continued)

*Primary Examiner* — Paul Huber
(74) *Attorney, Agent, or Firm* — Morgan, Lewis & Bockius LLP

(57) ABSTRACT

A client device with one or more processors and memory identifies an action mode of a user of the client device in an application while executing the application. The client device detects an event in the action mode. The client device adjusts an audio mixing mode of sound effects in the application (e.g., adjusting a volume of audio associated with the event and a volume of background music for the application) based on the detected event.

17 Claims, 6 Drawing Sheets

(51) Int. Cl.
*A63F 13/30* (2014.01)
*H04L 29/06* (2006.01)

(56) References Cited

U.S. PATENT DOCUMENTS

| | | | | |
|---|---|---|---|---|
| 2008/0305872 | A1* | 12/2008 | Okada | G07F 17/3262 463/35 |
| 2010/0317437 | A1* | 12/2010 | Berry | G07F 17/32 463/35 |
| 2011/0311057 | A1* | 12/2011 | Jamro | H04R 5/04 381/1 |
| 2013/0283162 | A1* | 10/2013 | Aronsson | G11B 27/105 715/719 |

FOREIGN PATENT DOCUMENTS

| | | |
|---|---|---|
| CN | 101196924 A | 6/2008 |
| CN | 201976240 U | 9/2011 |
| CN | 102693720 A | 9/2012 |
| CN | 102750964 A | 10/2012 |

OTHER PUBLICATIONS

Tencent Technology, IPRP, PCT/CN2013/087807, Jun. 30, 2015, 5 pgs.

* cited by examiner

METHOD AND DEVICE FOR PRIORITIZING AUDIO DELIVERY IN AN APPLICATION

RELATED APPLICATIONS

This application is a continuation application of PCT Patent Application No. PCT/CN2013/087807, entitled "METHOD AND DEVICE FOR PRIORITIZING AUDIO DELIVERY IN AN APPLICATION" filed on Nov. 26, 2013, which claims priority to Chinese Patent Application Serial No. 201210572012.2, entitled "Method and Client Terminal for Processing Game Music", filed Dec. 25, 2012, the entirety of both of which is incorporated herein by reference.

TECHNICAL FIELD

The present application relates to the field of Internet technologies, and more particularly to a method and device for adjusting an audio mixing mode for sound effects in the application (e.g., prioritizing audio delivery of different sound effects or audio instructions) in an application.

BACKGROUND

With the development and popularization of the Internet, games have become one of the main applications utilizing the Internet. More and more Internet users are participating in online games. In general, types of Internet games include: large multi-player online games; stand-alone games; online games supporting instant message; or other online games. Regardless of the game type, in the client-side portion of the game, audio generated for different in-game scenarios and background music can be played to enhance the user's participation in the game.

However, in the conventional client-side portion of the game, audio generated for the current in-game scenario and background music of the game are jumbled together without careful management. This causes a feeling that audio generated for the in-game scenario and the background music has unclear structures and are indistinguishable, which diminishes the user's experience.

SUMMARY

In order to solve the problems in the prior art, the embodiments of the present application provide a method and device for adjusting an audio mixing mode for sound effects in the application in the application (e.g., including prioritizing audio delivery of different sound effects and/or audio instructions) based on the current in-game scenarios, the current user action mode, and the types of events that are occurring in the game. In some embodiments, the method is performed at a client side device (e.g., client device 502, FIGS. 5-6) with one or more processors and memory. The method includes: while executing an application, identifying an action mode of a user of the client device in the application. The method further includes: detecting an event in the action mode; and based on the event, adjusting an audio mixing mode of sound effects in the application (e.g., including adjusting a default volume of audio associated with the event and a current volume of background music for the application for immediate playback in the application).

In some embodiments, a client device (e.g., client device 502, FIGS. 5-6) includes one or more processors and memory storing one or more programs for execution by the one or more processors, the one or more programs include instructions for performing the operations of the methods described herein. In some embodiments, a non-transitory computer readable storage medium storing one or more programs, the one or more programs comprising instructions, which, when executed by a client device (e.g., client device 502, FIGS. 5-6) with one or more processors, cause the client device to perform the operations of the methods described herein.

Various advantages of the present application would be apparent in light of the descriptions below.

BRIEF DESCRIPTION OF THE DRAWINGS

The aforementioned features and advantages of the present application as well as additional features and advantages thereof will be more clearly understood hereinafter as a result of a detailed description of preferred embodiments when taken in conjunction with the drawings.

In order to explain the technical program in the embodiment of the present application clearly, the following will briefly introduce the attached drawings required in the description of the embodiment or the conventional technology, obviously, the drawings in the following description are only some embodiments of the present application, for the common technicians of this field, they can also obtain other drawings according to these drawings without any creative labor.

Like reference numerals refer to corresponding parts throughout the several views of the drawings.

DESCRIPTION OF EMBODIMENTS

Reference will now be made in detail to embodiments, examples of which are illustrated in the accompanying drawings. In the following detailed description, numerous specific details are set forth in order to provide a thorough understanding of the subject matter presented herein. But it will be apparent to one skilled in the art that the subject matter may be practiced without these specific details. In other instances, well-known methods, procedures, components, and circuits have not been described in detail so as not to unnecessarily obscure aspects of the embodiments.

The following gives specific description of embodiment of the present application in combination of attached drawings.

Figure 1:
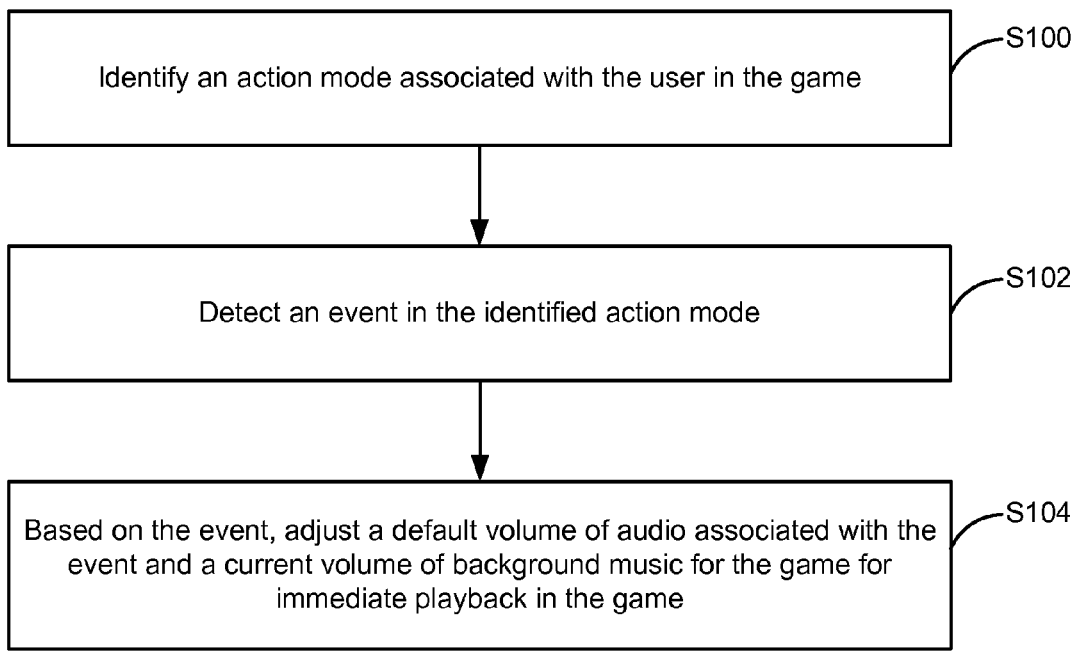
FIG. 1 is a flowchart diagram of a method of adjusting an audio mixing mode of sound effects (e.g., including prioritizing audio delivery of different sound effects and audio instructions) in an application in accordance with some embodiments.

FIG. 1 is a flowchart diagram of a method of adjusting an audio mixing mode of sound effects (e.g., including prioritizing audio delivery of different sound effects and audio instructions) in an application in accordance with some embodiments. In some embodiments, the method is performed by a client-side module of a client device with one or more processors and memory.

In some embodiments, a user of the client device executes an application or game. In some embodiments, the user is required to log into the game via a client-side module associated with the game executed by the client device in order to take part in the game. In some embodiments, the game is either a network game (e.g., multi-player) or a personal game (e.g., single player). In some embodiments, the client device stores various files for the game including, without limitation, one or more game music files, video files, system configuration files, user data files, etc.

Among which, the stored game music files includes a background music file and one or more other audio files for various sound effects and/or audio instructions to be played back during the game. The game's background music file includes a soundtrack or a plurality of music files to be played in the background during game play. The one or more audio files correspond to various events occurring during a respective action mode or in-game scenario. The action modes include, without limitation a confrontation mode and a task execution mode. The one or more audio files include, without limitation: one or more sound effect files for the confrontation mode; one or more speech prompt files or audio instruction files for the task execution mode; and one or more emergency sound effect files.

The sound effect files for the confrontation mode includes a plurality of audio files for action sound effects generated by a confrontation between the user and an adversary in the game. In some embodiments, when the user is playing a multi-player game, the adversary is another user associated with a different client device (e.g., a user playing in an opponent's team in a combat game, or an opponent in a fighting game, etc.). In some embodiments, when the user is playing a single player game, the adversary is an artificial intelligence or non-player entity controlled by the game that is not associated with a human user. For example, when there is a striking action between the user and the adversary in the confrontation, there are corresponding action sound effects for the striking action (e.g., the sounds of impact between weapons, the vocal sounds made by the players' characters, the sound effects indicative of the use of a particular move or the activation of a particular weapon, etc.). The speech prompt or audio instruction files for the task execution mode include speech files indicating the completion of a task or instructing the user to perform tasks. The speech prompt or audio instruction files contain important guidance information for the user to proceed effectively in the game. The emergency sound effect files include emergency audio, for playback while in the confrontation mode. For example, the emergency audio indicates that the user's health is low and also prompts the user to take a corresponding operation (e.g., making evasive maneuvers, disengaging from combat, or taking a remedy potion, etc.).

Step S100: The client-side module identifies the current action mode or in-game scenario associated with the user in the game. In some embodiment, a system configuration file associated with the game is stored at the client device which includes information of various action modes and refers to the action modes with indication information. When the user enters into an action mode, indication information corresponding to the action mode is cached in the user data file. In some embodiments, the client-side module determines the current action mode of the user in the game by querying the user data file for indication information. In some embodiments, the indication information includes the user's in-game location. In some embodiments, in-game locations are associated with a respective action mode. For example, a gladiator arena location is associated with the confrontation mode, and a workshop or residence/headquarters location is associated with the task execution mode.

Step S102: The client-side module detects an event occurring in the identified action mode. In some embodiments, events in the confrontation mode include, without limitation: a preliminary confrontation event; a confrontation event; and an emergency event. For example, preparation for battle, such as putting on armor, is a preliminary confrontation event, and engaging in battle is a confrontation event. In some embodiments, events in the task execution mode include, without limitation: a task completion event; and a task instruction event. For example, finding buried treasure, finishing training, finishing travel, or collecting all items for a quest are task completion events. For example, the task instruction event includes a tutorial or instruction that teaches the user how to perform an action or achieve a goal in the game.

Step S104: The client-side module adjusts the audio mixing mode of sound effects in the application based on the detected event, including adjusting a default volume of audio associated with the detected event and the current volume of the background music of the game for immediate playback in the game. For example, an audio file associated with the event includes sound effects and speech. In some embodiments, when an event occurs, the client-side module decreases the volume of the background music of the game and increases the volume of the audio file associated with the detected event. Priority is given to audio associated with the event over the background music to focus the user's attention on the current event. Sometimes, there may be multiple audio files that need to be played substantially concurrently in the game for a series of events that occur within a very short burst of time. For example, in a multi-player game, there are many players taking different actions at the same time, each action may be associated with a respective sound effect (e.g., the sound effects associated with pitching a grenade, shooting a machine gun, running, getting into a critical health level, etc.). Conventional techniques using a default sound mixing mode simply mix these concurrent sound effects using their default volumes without careful management. As a result, when the mixed sound is played back, the user can only hear a jumble of sounds, which diminishes the user's enjoyment of the game. The default mixing mode may work acceptably when events are occurring at a slow pace and do not overlap with one another. A more sophisticated mixing mode is needed when there are more than one or two sound effects being played together. Also, in a default mixing mode, the volume of the background music is constant and preset by the user. The background music can be distracting when there are other sound effects that are more pertinent to the user's game play (e.g., the action sound effects and the audio instructions). A more sophisticated mixing mode decreases the current volume of the background music in light of other sounds effects that need to be played at the present time, and prioritize the delivery of the other sound effects over the delivery of the background music. In some embodiments, the more sophisticated mixing modes also prioritizes the different sound effects among themselves based on the current action mode, and the relative importance of the different sound effects for the current action mode. In other words, depending on the respective types, nature, quantity of the sound effects to be playback concurrently in the game as a result of the current game play scenario, the same sound effect associated with the same event may take on different volumes in different game play scenarios.

In some embodiments, when the user executes (e.g., enters or logs into) the game, the client-side module reads the game's background music file and causes the background music to be played. The client-side module includes controls that enable the user to adjust the volume of the background music. For example, when a confrontation event occurs, the client-side module reads an audio file associated with the confrontation event and causes playback of sound effects in the audio file associated with the confrontation event. Subsequently, in this example, the client-side module decreases the volume of the background music of the game and increases the volume of the audio file associated with the confrontation event according to a preset configuration file. As such, the client-side module prioritizes sound delivery by giving prominence to audio associated with the confrontation event in order to distinguish from the game's background music. In some embodiments, the preset configuration file is a system configuration file for adjusting volume, which includes predetermined values for the volume of the game's background music and the volume of the audio file associated with the event. In some embodiments, the game includes a configuration file that specifies different mixing modes each specifying a respective set of mixing parameters (e.g., respective volumes) associated with different types of sound effects and/or audio instructions to be played back substantially concurrently. In some embodiments, the configuration file specifies the respective conditions (e.g., the required action mode, event types, game scenarios, etc.) for using each mixing mode.

Embodiments of the present application provide a means for prioritizing sound delivery in a game by identifying the current action mode and detecting an event in the current action mode to adjust the volume of the audio file associated with the event and the volume of the game's background music based on the detected event. Thereby, the game's background music and event audio are distinguishable by giving prominence to the current event's audio (e.g., increasing the volume event audio and decreasing the volume of the background music) to increase the users' experience in the game.

Figure 2:
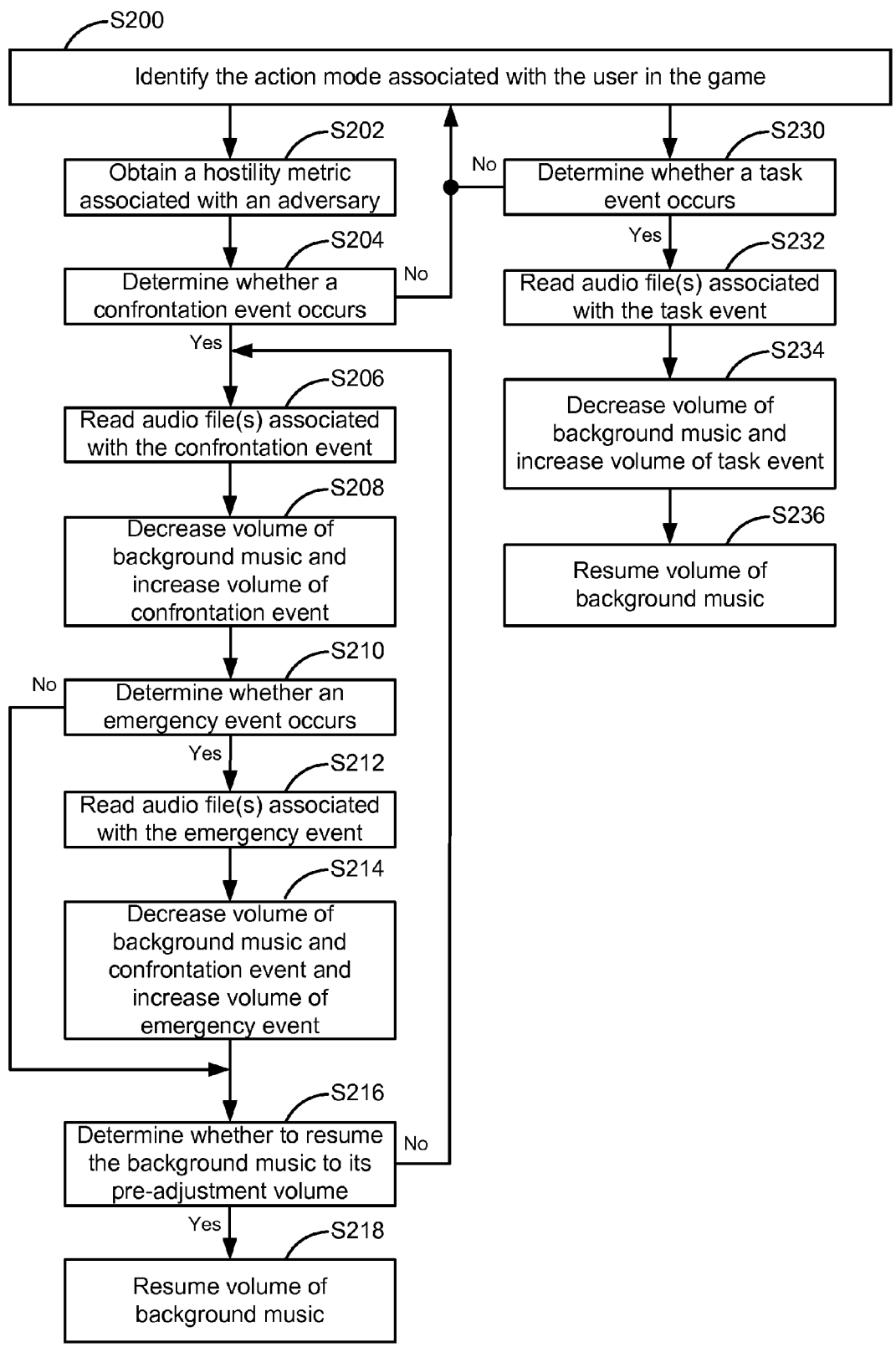
FIG. 2 is a flowchart diagram of a method of adjusting an audio mixing mode of sound effects (e.g., including prioritizing audio delivery of different sound effects and audio instructions) in an application in accordance with some embodiments.

FIG. 2 is a flowchart diagram of a method of prioritizing audio delivery in an application in accordance with some embodiments. In some embodiments, the method is performed by a client-side module of a client device with one or more processors and memory. In some embodiments, when the user executes (e.g., enters or logs into) the game, the client-side module reads the games background music file and causes playback of the background music.

Step S200: The client-side module identifies the current action mode or in-game scenario associated with the user in the game. In some embodiment, a system configuration file associated with the game is stored at the client device which includes information of various action modes and refers to the action modes with indication information. When the user enters into an action type, indication information corresponding to the action type is cached in the user data file.

In some embodiments, the client-side module determines the current action mode of the user in the game by querying the user data file for indication information. The action modes include, without limitation a confrontation mode and a task execution mode. The confrontation mode is a game play mode where the user confronts an in-game adversary. For example, in the confrontation mode, the user battles a monster or many monsters in the game, or the user battles with another user or another team of users in the game. For example, in the task execution mode, the user executes non-confrontational tasks such as acquiring resources, training, traveling, communicating with other users, resting, or performing other tasks prescribed in the game.

In some embodiments, if the identified action mode is the confrontation mode, the client-side module conducts Step S202; however, if the identified action mode is the task execution mode, the client-side module conducts Step S218.

After identifying the action mode as the confrontation mode, Step S202: The client-side module obtains a hostility metric associated with a party in the game other than the user of the client device (e.g., a potential adversary). In some embodiments, when the user is playing a multi-player game, the potential adversary is another user associated with a different client device. In some embodiments, when the user is playing a single player game, the potential adversary is an artificial intelligence or non-player entity controlled by the game and is not associated with a human. In some embodiments, the hostility metric associated with the potential adversary can be set in the system configuration file, which is a parameter of the confrontation mode and an attribute corresponding to the potential adversary. In some embodiments, the hostility metric determines whether the potential adversary is hostile to or is currently confronting the user, which serves as a trigger condition for the confrontation event. For example, when the user is within a predetermined confrontation distance or range of the potential adversary, the potential adversary's hostility metric will increase and the potential adversary will attack the user, thereby causing the confrontation event to occur.

In some embodiments, when the hostility metric associated with the potential adversary exceeds a predetermined confrontation threshold (e.g., a value greater than zero), the client-device determines that a confrontation event is imminent and conducts Step S204. In some embodiments, when the hostility metric associated with the potential adversary does not exceed the predetermined confrontation threshold (e.g., a zero value), the client-device determines that a confrontation event is not imminent and conducts Step S200. As such, the volume of the game's background music is not adjusted and kept at its current volume.

Step S204: The client-side module determines whether a confrontation event occurs (e.g., between the user and the potential adversary). In some embodiments, the client-side module determines that the confrontation event has occurred when the client-side module detects one or more operating actions of the user, the operating state of the user, or a change in the hostility metric of the adversary. The one or more operating actions of the user include, without limitation, offensive and defensive actions, position/location within the game environment, usage of articles in the game environment (e.g., picking up props and hiding behind scenery), and other user actions during the confrontation event. The operating state includes, without limitation, the user's health or first aid state.

In some embodiments, when the client-side module detects an operating action performed by the user on the adversary (e.g., the user begins attacking the adversary or vice versa) or the user's operating state (e.g., the user's health begins decreasing), the client-side module determines that the confrontation event has occurred and conducts Step S206. Alternatively, in some embodiments, when the client-side module detects that the hostility metric of the adversary changes (e.g., the adversary becomes hostile to the user), the client-side module determines that the confrontation event has occurred and conducts Step S206.

In some embodiments, when the client-side module does not detect an operating action performed by the user on the adversary or the user's operating state, the client-side module determines that the confrontation event has not occurred and conducts Step S200. Alternatively, in some embodiments, when the client-side module does not detect a change in the hostility metric of the adversary, the client-side module determines that the confrontation event has not occurred and conducts Step S200.

Step S206: The client-side module reads one or more audio files associated with the confrontation event. In some embodiments, the client-side module causes playback of sound effect(s) in the audio file(s) associated with the confrontation event.

Step S208: The client-side module adjusts the volume of the audio file associated with the confrontation event and the volume of the background music of the game by decreasing the volume of the game's background music and increasing the volume of the audio file associated with the confrontation event. In some embodiments, the volume adjustment is performed according to a confrontation volume adjustment parameter in a preset configuration file. In some embodiments, the preset configuration file includes predetermined values for the volume of the game's background music and the volume of the audio file associated with the confrontation event. Priority is given to audio associated with the confrontation event over the background music.

In some embodiments, if the confrontation event is associated with multiple sound effects or if multiple different confrontational events are happening concurrently in the game, the client-side module uses a mixing mode that harmonizes the different sound effects, such that the user can still clearly hear each sound effect, but is not overwhelmed by the total volume of the combined sound effects. For example, in some embodiments, the client module optionally uses a mixing mode in which the respective volumes of the sound effects associated with the same type of adversaries are adjusted according to the relative distance between the user's character and the adversary (e.g., louder volumes for adversaries that are closer to the user's characters). In some embodiments, the respective volumes for the sound effects associated with different adversaries can be adjusted according to the different amount of threat posed by the different adversaries. In some embodiments, the sound effects associated with actions of the adversaries, and actions of the user's character, and/or the actions of the user's teammates, can be mixed in a way such that the sound effects associated with a relatively fresh type of action (e.g., a type of action that has not occurred in the past 30 seconds) is louder than a relatively routine type of action (e.g., a type of action that has occurred more than once in the past minute). For example, in a battle, the first shot fired would be given a very high volume, but subsequent gun fires may be given a lower volume than the volume for opening a medical box for the first time while the battle is going on. This mixing mode allows the user to be alerted of new situations that occur in the game, such that the user can pay more attention to them. Once an event or action has become a routine event, the volume for the sound effects associated with the event or action can be reduced so as not to distract the user from other events that are going on. In some embodiments, if the sound effects associated with the same type of events are to be played substantially concurrently, the client-side module adjust the timing of the sound effects such that they do not clash or create a ringing resonance with one another. The type of mixing modes suitable for different situations can be designed in accordance with the type of games in question, and the type of sound effects and their uses in different game play scenarios.

Step S210: The client-side module determines whether an emergency event occurs. In some embodiments, the emergency state occurs when the operating state of the user is below a predetermined operating threshold (e.g., a low health threshold). In some embodiments, firstly, the client-side module obtains the user's operating state and, in accordance with a determination that the user's operating state is below the predetermined operating threshold, the client-side module determines that the emergency event has occurred. In some embodiments, the emergency event indicates that the user is in a dangerous state in the game, so it is necessary to trigger emergency sound effects corresponding to the emergency event to prompt the user to perform corresponding operations (e.g., evasive maneuvers). For example, the emergency sound effect is the sound of a fast beating heart.

In some embodiments, if client-side module determines that the emergency event has occurred, the client-side module conducts Step S212; however, if client-side module determines that the emergency event has not occurred, the client-side module conducts Step S216.

Step S212: The client-side module reads an audio file associated with the emergency event. In some embodiments, the client-side module causes playback of emergency sound effects in audio file associated with the emergency event.

Step S214: The client-side module decreases the volumes of the game's background music and the audio file associated with the confrontation event, and increases the volume of the audio file associated with the emergency event. In some embodiments, the emergency sound effects are given the highest priority over the background music and confrontation event audio. For example, at this point, it is necessary to give the emergency sound effects highest priority because the user's health is low. As such, the volume of all other music except the emergency sound effect is decreased. In some embodiments, the volume adjustment is performed according to an emergency volume adjustment parameter in a preset configuration file. In some embodiments, the preset configuration file includes predetermined values for the volume of the game's background music, the volume of the audio file associated with the confrontation event and the volume of the audio file associated with the emergency event.

Step S216: The client-side module determines whether to resume the background music to its pre-adjustment volume (e.g., to the level prior to adjustment in S208). In some embodiments, the client-device determines that the confrontation event is complete when the hostility metric associated with the adversary does not exceed the predetermined confrontation threshold (e.g., zero). Alternatively, the client-device determines that the confrontation event is complete when playback of the audio associated with the emergency event is complete.

In some embodiments, when the user confronts the adversary, the hostility metric of adversary will change and reduce gradually. For example, when the hostility metric is reduced to 0, the confrontation event is complete. After determining that the confrontation event is complete, the client-side module conducts Step S218. After determining that the confrontation event is not complete (e.g., the hostility metric is not reduced to 0), the client-side module conducts Step S206.

Step S218: After determining that the confrontation event is complete, client-side module resumes the pre-adjustment volume of the background music. In some embodiments, the client-side module increases the volume of the background music to the level prior to S208.

After identifying the action mode as the task execution mode, Step S230: The client-side module determines whether a task event occurs. For example, when a task is completed successfully, a task completion indicator is cached in the user data file. The client-side module determines that a task event (e.g., a task completion success event) has occurred by querying the user data file and reading the task completion indicator. In some embodiments, after determining that the task event has occurred, the client-side module conducts Step S232. In some embodiments, after determining that the task event has not occurred, the client-side module conducts Step S200.

Step S232: The client-side module reads the audio file associated with the task event. In some embodiments, for example, the client-side module causes playback of speech prompts (e.g., "Well done!" or "Go and find the red dragon in the Mystic Grotto.") in the audio file associated with the task event (e.g., the task completion success event or a task instruction event).

Step S234: The client-side module decreases the volume of the game's background music and increases the volume of the audio file associated with the task event. In some embodiments, the volume adjustment is performed according to a task volume adjustment parameter in preset configuration file. In some embodiments, the preset configuration file includes predetermined values for the volume of the game's background music and the volume of the audio file associated with the task event.

Step S236: After the audio file associated with the task event is played completely, the client-side module resumes the pre-adjustment volume of the background music. In some embodiments, the client-side module increases the volume of the background music to the level prior to S234.

In some embodiments, the sound effects associated with the task event and adversary event, and other events in a current game scenario are all adjusted in accordance with the specifications of a respective sound mixing mode selected according to the type, nature, and total number of events that are occurring concurrently or substantially concurrently in the game.

Embodiments of the present application provide a means for prioritizing sound delivery in a game by identifying the current action mode and detecting an event or events in the current action mode to adjust the volumes of the audio files associated with the event(s) and the volume of the game's background music based on the detected event(s). Thereby, the game's background music and event audios are distinguishable by giving different levels of prominence to the event audio(s) (e.g., increasing the volume of the event audio(s) and decreasing the volume of the background music) to increase the users' experience in the game.

Figure 3:
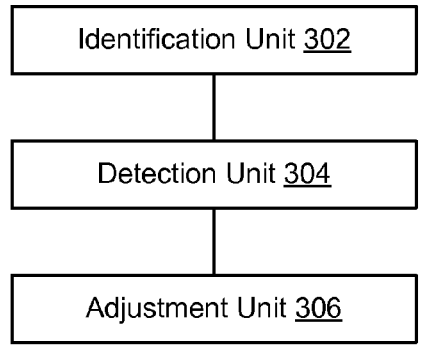
FIG. 3 is a block diagram for a client-side module for adjusting an audio mixing mode of sound effects (e.g., including prioritizing audio delivery of different sound effects and audio instructions) in an application in accordance with some embodiments.

FIG. 3 is a block diagram for a client-side module 300 for adjusting an audio mixing mode (e.g., including prioritizing audio delivery of different sound effects) in an application in accordance with some embodiments. In some embodiments, client-side module 300 is associated with an application or game being executed on a client device with one or more processors and memory.

In some embodiments, client-side module 300 includes: identification unit 302; detection unit 304; and adjustment unit 306.

In some embodiments, Identification unit 302 is configured to identify the current action mode or in-game scenario associated with the user in the game. In some embodiment, a system configuration file associated with the game is stored at the client device which includes information of various action modes and refers to the action modes with indication information. When the users enter into an action mode, indication information corresponding to the action mode is cached in user data file. In some embodiments, identification unit 302 determines the current action mode of the user in the game by querying the user data file for indication information.

In some embodiments, Detection unit 304 is configured to detect an event occurring in the identified action mode. In some embodiments, events in the confrontation mode include, without limitation: a preliminary confrontation event; a confrontation event; and an emergency event. In some embodiments, events in task execution mode include, without limitation: a task completion event; and a task instruction event.

In some embodiments, Adjustment unit 306 is configured to adjust an audio mixing mode (e.g., including adjusting the respective default volume(s) of audio file(s) associated with the detected event(s) and the current volume of the background music of the game for immediate playback in the game) based on the detected event(s). In some embodiments, when an event occurs, adjustment unit 306 decreases the volume of the background music of the game and increases the volume of an audio file associated with the detected event.

In some embodiments, when the user executes (e.g., enters or logs into) the game, client-side module 300 reads the game's background music file and causes playback of the background music. Client-side module 300 includes controls that enable the user to adjust the volume of the background music. For example, when a confrontation event occurs, client-side module reads 300 one or more audio files associated with the confrontation event. Thereafter, in this example, adjustment unit 306 decreases the volume of background music of the game according to a preset configuration file, and increases the volume of the audio file associated with the confrontation event. As such, client-side module 300 prioritizes sound delivery by giving prominence to audio associated with the confrontation event in order to distinguish from the game's background music.

Embodiments of the present application provide a means for prioritizing sound delivery in a game by identifying the current action mode and detecting event(s) in the current action mode to adjust the respective volume(s) of the audio file(s) associated with the event(s) and the volume of the game's background music based on the detected event(s). Thereby, the game's background music and event audios are distinguishable by giving different levels of prominence to the event audios (e.g., differentially increasing the volume of the event audio(s) and decreasing the volume of the background music) to enhance the users' experience in the game.

Figure 4:
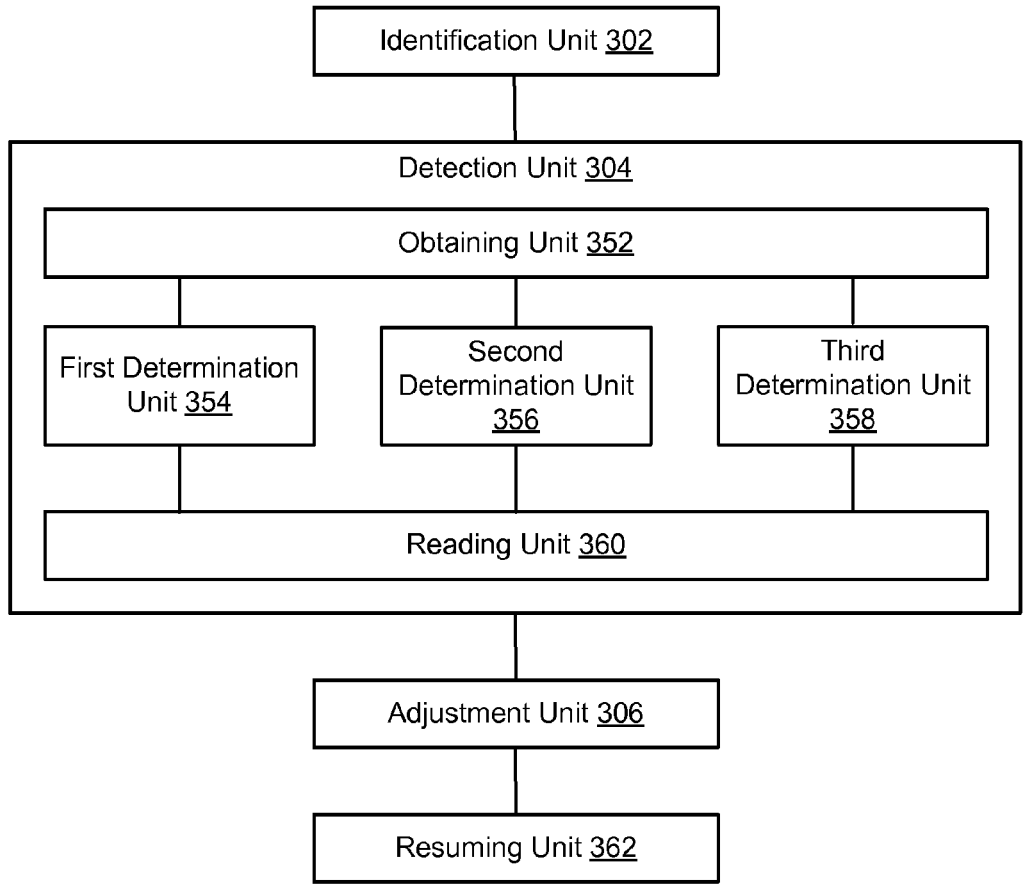
FIG. 4 is a block diagram for a client-side module for adjusting an audio mixing mode of sound effects (e.g., including prioritizing audio delivery of different sound effects and audio instructions) in an application in accordance with some embodiments.

FIG. 4 is a block diagram for a client-side module 350 for prioritizing audio delivery in an application in accordance with some embodiments. In some embodiments, client-side module 350 is associated with an application or game being executed on a client device with one or more processors and memory. In some embodiments, when the user executes (e.g., enters or logs into) the game, client-side module 350 firstly reads the game's background music file and plays the background music.

In some embodiments, client-side module 350 includes: identification unit 302; detection unit 304; adjustment unit 306; and resuming unit 362. Among which, determination detection unit 304 includes: obtaining unit 352; first determination unit 354; second determination unit 356; third determination unit 358; and reading unit 360.

In some embodiments, Identification unit 302 is configured to identify the current action mode or in-game scenario associated with the user in the game.

In some embodiments, Obtaining unit 352 is configured to obtain a hostility metric associated with a potential adversary in the game when identification unit 302 identifies that the current action mode is the confrontation mode. In some embodiments, the hostility metric associated with the potential adversary can be set in the system configuration file, which is a parameter of the confrontation mode and an attribute corresponding to the potential adversary. In some embodiments, the hostility metric determines whether the potential adversary is hostile to or is currently confronting the user, which serves as a trigger condition for the confrontation event. For example, when the user is within a predetermined confrontation distance or range of the potential adversary, the potential adversary's hostility metric will increase and the potential adversary will attack the user, thereby causing the confrontation event to occur.

In some embodiments, First determination unit 354 is configured to determine whether a confrontation event occurs (e.g., between the user and the potential adversary) after obtaining module 352 obtains the hostility metric of the potential adversary. In some embodiments, first determination unit 354 determines that the confrontation event has occurred after detecting one or more operating actions of the user, the operating state of the user, or a change in the hostility metric of the adversary.

In some embodiments, Reading module 360 is configured to read the audio file associated with the confrontation event after first determination module 354 determines that the confrontation event has occurred. In some embodiments, client-side module 350 causes playback of sound effects in the audio file associated with the confrontation event.

In some embodiments, Adjustment unit 306 is configured to decrease the volume of the game's background music and increase the volume of the audio file associated with the confrontation event after reading module 360 reads the audio file associated with the confrontation event. In some embodiments, the volume adjustment is performed according to a confrontation volume adjustment parameter in a preset configuration file. In some embodiments, the preset configuration file includes predetermined values for the volume of the game's background music and the volume of the audio file associated with the confrontation event.

In some embodiments, Second determination unit 356 is configured to determine whether an emergency event occurs. In some embodiments, obtaining module 352 is further configured to obtain the user's operating state. Second determination unit 356 is configured to determine whether an emergency event has occurred based on the user's operating state (e.g., when the user's health is low).

In some embodiments, Reading module 360 is further configured to read an audio file associated with the emergency event after second determination unit 356 determines that the emergency event has occurred. In some embodiments, client-side module 350 causes playback of emergency sound effects in the audio file associated with the emergency event.

In some embodiments, Adjustment unit 306 is further configured to decrease the volumes of the game's background music and the audio file associated with the confrontation event, and increase the volume of the audio file associated with the emergency event after reading module 360 reads the audio file associated with the emergency event.

In some embodiments, Resuming unit 362 is configured to resume the pre-adjustment volume of the background music when the confrontation event is complete (e.g., the level prior to adjusting the background music volume with adjustment unit 306). In some embodiments, resuming unit 362 is configured to determine that the confrontation event is complete when the hostility metric associated with the adversary does not exceed the predetermined confrontation threshold (e.g., zero). Alternatively, resuming unit 362 is configured to determine that the confrontation event is complete when playback of the audio associated with the emergency event is complete.

In some embodiments, Third determination unit 358 is configured to determine whether a task event occurs in the task execution mode after identification unit 302 identifies that the current action mode is the task execution mode. In some embodiments, obtaining unit 352 is further configured to obtain a task completion mark stored in the user data file. In some embodiments, third determination unit 358 is configured to determine that a task event has occurred when obtaining unit 352 obtains the task completion mark.

In some embodiments, Reading module 324 is further configured to read the audio file associated with the task event after the third determination unit 358 determines that the task event has occurred. In some embodiments, client-side module 350 causes playback of a speech prompting in the audio file associated with the task event (e.g., the task completion success event).

In some embodiments, Adjustment unit 306 is further configured to decrease the volume of the game's background music and increase the volume of the audio file associated with the task event. In some embodiments, the volume adjustment is performed according to a task volume adjustment parameter in preset configuration file. In some embodiments, the preset configuration file includes predetermined values for the volume of the game's background music and the volume of the audio file associated with the task event.

In some embodiments, Resuming unit 362 is further configured to resume the volume of the game's background music to its pre-adjustment volume after the audio file associated with the task event is complete.

Embodiments of the present application provide a means for prioritizing sound delivery in a game by identifying the action mode and detecting event(s) in the current action mode to adjust the respective volume(s) of the audio file(s) associated with the event(s) and the volume of the game's background music based on the detected event(s). Thereby, the game's background music and event audios are distinguishable by giving different levels of prominence to the event audios (e.g., increasing the volume event audios to different levels and decreasing the volume of the background music) to increase the users' experience in the game. Other details of the client-side module 350 are described with respect to the methods shown in FIGS. 1 and 2 and accompanying descriptions. For example, the client-side module 350 optionally implements other units to perform various functions described with respect to the methods shown in FIGS. 1 and 2 and accompanying descriptions.

Figure 5:
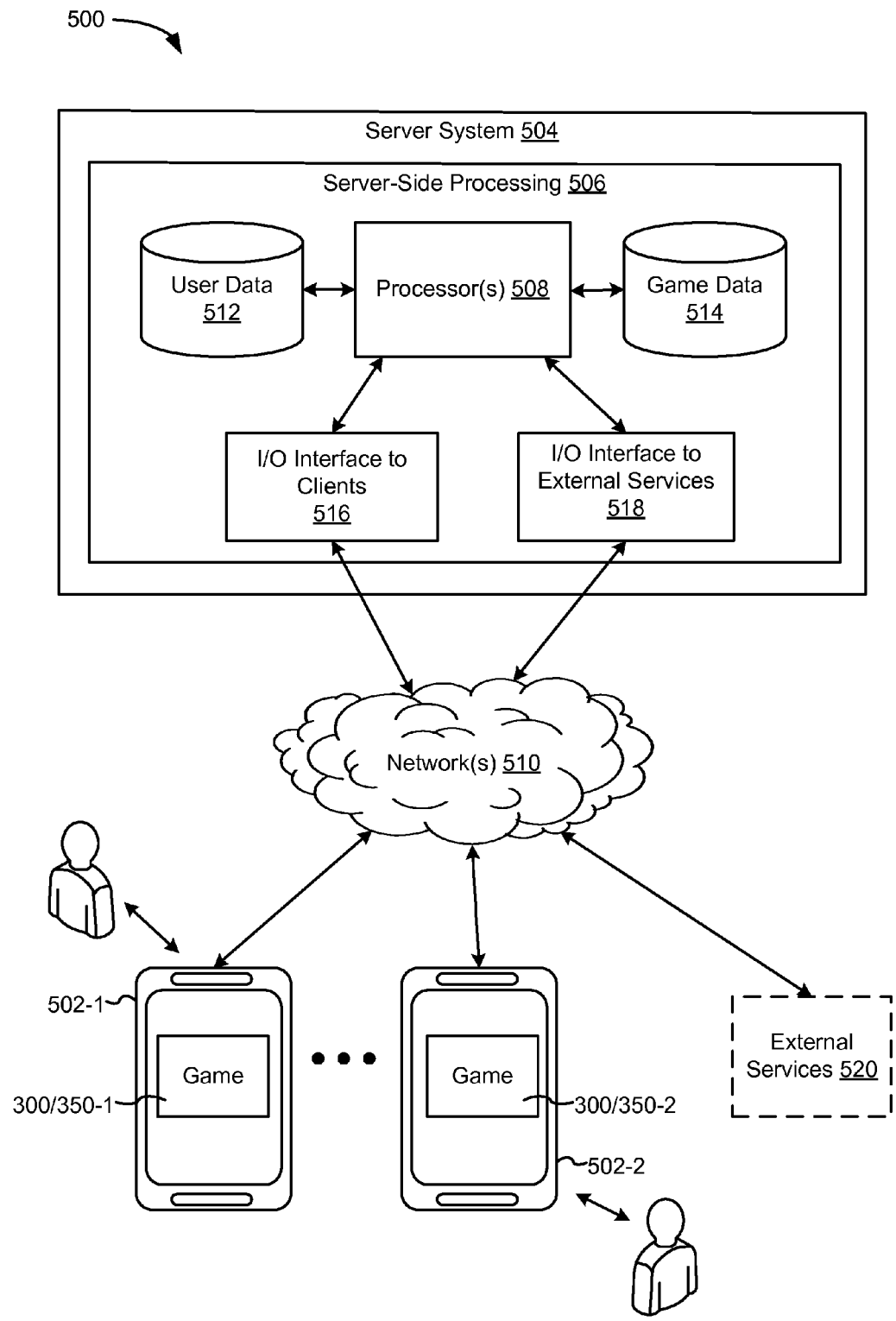
FIG. 5 is a block diagram of a server-client environment in accordance with some embodiments.

As shown in FIG. 5, in some embodiments, data processing for a game is implemented in a server-client environment 500. Data processing includes a client-side module 300/350-1, 300/350-2 (hereinafter "client module 300") executed on a client device 502-1, 502-2 and a server-side module 506 (hereinafter "server module 506") executed on a server system 504. Client module 300 communicates with server module 506 through one or more networks 510. Client module 300 provides client-side functionalities associated with a game or application such as client-facing input and output processing, communications with server module 506, and audio processing. Server module 506 provides server-side functionalities associated with the game or application for any number of client modules 300 each residing on a respective client device 502.

In some embodiments, server module 506 includes processor(s) 508, user data 512, game data 514, an I/O interface to client module 516, and an I/O interface to external services 518. I/O interface to client module 516 facilitates the client-facing input and output processing for server module 506. Processor(s) 508 receive requests from client module 300 associated with playing a game and coordinates game play between client modules 300. User data 512 stores data received from client module 300 (e.g., game play parameters) and game data 514 stores data associated with the game. In some embodiments, server module 506 communicates with external services 520 (e.g., an archival server with historical user data and player statistics or a financial transaction server for in-game purchases with real currency) through one or more networks 510. I/O interface to system administrator 518 facilitates such communications.

Examples of client device 502 include, but are not limited to, a handheld computer, a wearable computing device, a personal digital assistant (PDA), a tablet computer, a laptop computer, a desktop computer, a cellular telephone, a smart phone, an enhanced general packet radio service (EGPRS) mobile phone, a media player, a navigation device, a game console, a television, a remote control, or a combination of any two or more of these data processing devices or other data processing devices.

Examples of one or more networks 510 include local area networks ("LAN") and wide area networks ("WAN") such as the Internet. Communication network(s) 1010 are, optionally, implemented using any known network protocol, including various wired or wireless protocols, such as Ethernet, Universal Serial Bus (USB), FIREWIRE, Global System for Mobile Communications (GSM), Enhanced Data GSM Environment (EDGE), code division multiple access (CDMA), time division multiple access (TDMA), Bluetooth, Wi Fi, voice over Internet Protocol (VoIP), Wi-MAX, or any other suitable communication protocol.

Server system 504 is implemented on one or more standalone data processing apparatuses or a distributed network of computers. In some embodiments, server system 504 also employs various virtual devices and/or services of third party service providers (e.g., third-party cloud service providers) to provide the underlying computing resources and/or infrastructure resources of server system 504.

Although server-client environment 500 shown in FIG. 5 includes both a client-side portion (e.g., client module 300) and a server-side portion (e.g., server module 506), in some embodiments, data processing is implemented as a standalone application installed on user device 502. In addition, the division of functionalities between the client and server portions of client environment data processing can vary in different embodiments. For example, in some embodiments, client module 300 is a thin-client that provides only user-facing input and output processing functions, and delegates all other data processing functionalities to a backend server (e.g., server system 504).

Figure 6:
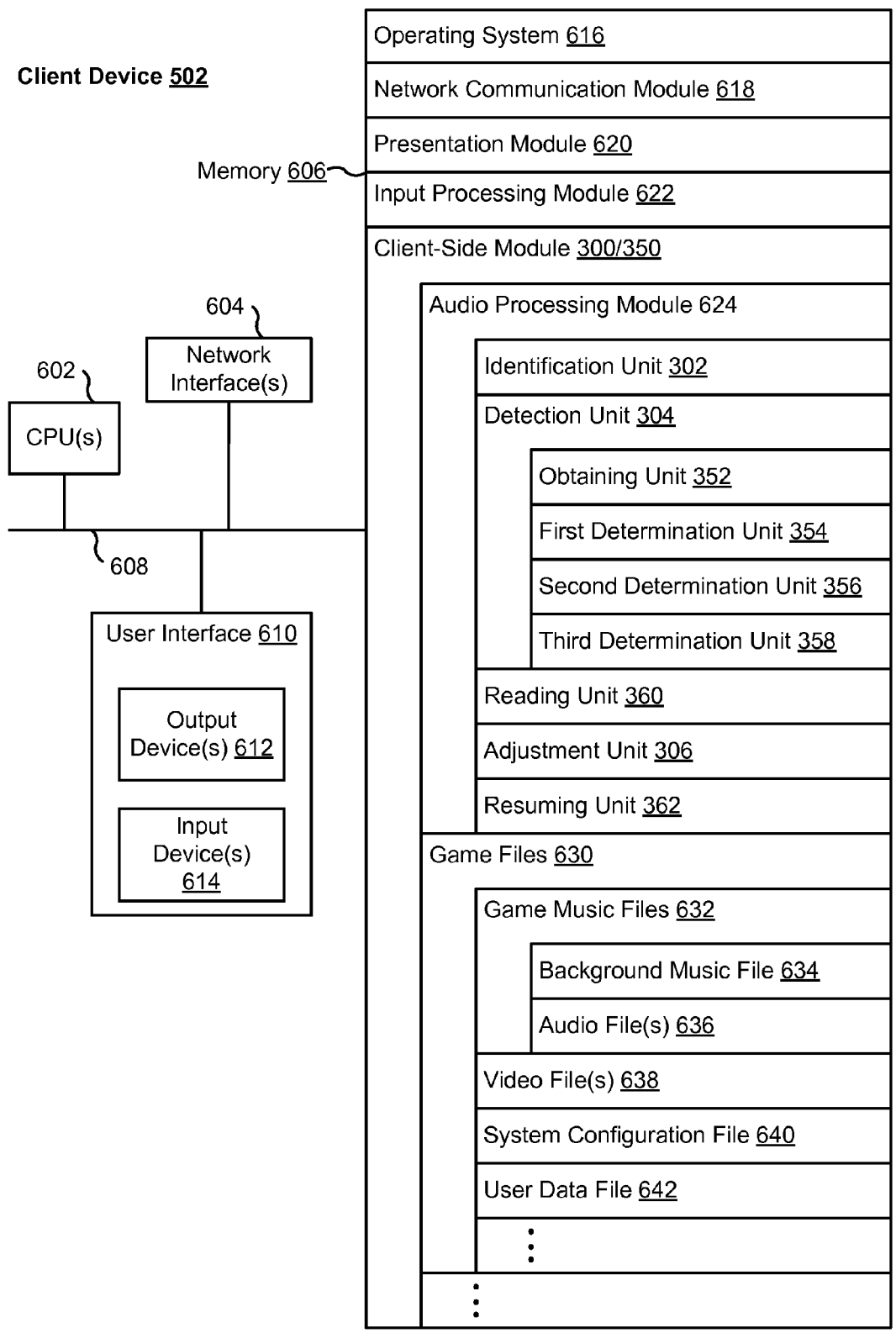
FIG. 6 is a block diagram of a client device in accordance with some embodiments.

FIG. 6 is a block diagram illustrating a representative client device 502 associated with a user in accordance with some embodiments. Client device 502, typically, includes one or more processing units (CPUs) 602, one or more network interfaces 604, memory 606, and one or more communication buses 608 for interconnecting these components (sometimes called a chipset). Client device 502 also includes a user interface 610. User interface 610 includes one or more output devices 612 that enable presentation of media content, including one or more speakers and/or one or more visual displays. User interface 610 also includes one or more input devices 614, including user interface components that facilitate user input such as a keyboard, a mouse, a voice-command input unit or microphone, a touch screen display, a touch-sensitive input pad, a gesture capturing camera, or other input buttons or controls. Furthermore, some client devices 502 use a microphone and voice recognition or a camera and gesture recognition to supplement or replace the keyboard. Memory 606 includes high-speed random access memory, such as DRAM, SRAM, DDR RAM, or other random access solid state memory devices; and, optionally, includes non-volatile memory, such as one or more magnetic disk storage devices, optical disk storage devices, flash memory devices, or other non-volatile solid state storage devices. Memory 606, optionally, includes one or more storage devices remotely located from CPU(s) 602. Memory 606, or alternately the non-volatile memory device(s) within memory 606, includes a non-transitory computer readable storage medium. In some implementations, memory 606, or the non-transitory computer readable storage medium of memory 606, stores the following programs, modules, and data structures, or a subset or superset thereof:

an operating system 616 including procedures for handling various basic system services and for performing hardware dependent tasks;

a network communication module 618 for connecting user device 502 to other computers (e.g., server system 504) connected to one or more networks 510 via one or more communication network interfaces 604 (wired or wireless);

a presentation module 620 for enabling presentation of information (e.g., a user interface for a web page or an application program, a game, audio and/or video content, text, etc.) at client device 502 via one or more output devices 612 (e.g., displays, speakers, etc.) associated with user interface 610; and an input processing module 622 for detecting one or more user inputs or interactions from one of the one or more input devices 614 and interpreting the detected input or interaction.

In some embodiments, memory 606 also includes a client-side module 300/350 for performing data processing for a respective application or game being executed by the user of client device 502. Client-side module 622 includes, but is not limited to:

audio processing module 624 for prioritizing sound delivery in an application or game, including:
an identification unit 302 for identifying a current action mode or in-game scenario associated with the user in the game;

a detection unit 304 for detecting an event occurring in the identified action mode, including:
an obtaining unit 352 for obtaining a hostility metric associated with a potential adversary in the game;
a first determination unit 354 for determining whether a confrontation event occurs;
a second determination unit 356 for determining whether an emergency event occurs; and
a third determination unit 358 for determining whether a task event occurs;
a reading unit 360 for reading an audio file associated with an event and for causing playback of the audio file;
an adjustment unit 306 for adjusting the volume of an audio file associated with the detected event and the volume of the background music of the game; and
a resuming unit 362 for resuming the pre-adjustment volume of the background music and for determining whether an event is complete;
game files 630 corresponding to the game, including:
game music files 362, including:
a background music file 634 with a soundtrack or a plurality of music files to be played in the background while playing the game; and
one or more audio files 636 corresponding to various events in the game;
one or more video files 638 for the game;
a system configuration file 640 with a plurality of parameters associated with audio processing; and
a user data file 642 storing information associated with the user's in-game actions.

Each of the above identified elements may be stored in one or more of the previously mentioned memory devices, and corresponds to a set of instructions for performing a function described above. The above identified modules or programs (i.e., sets of instructions) need not be implemented as separate software programs, procedures, modules or data structures, and thus various subsets of these modules may be combined or otherwise re-arranged in various implementations. In some implementations, memory 606, optionally, stores a subset of the modules and data structures identified above. Furthermore, memory 606, optionally, stores additional modules and data structures not described above.

Figure 7:
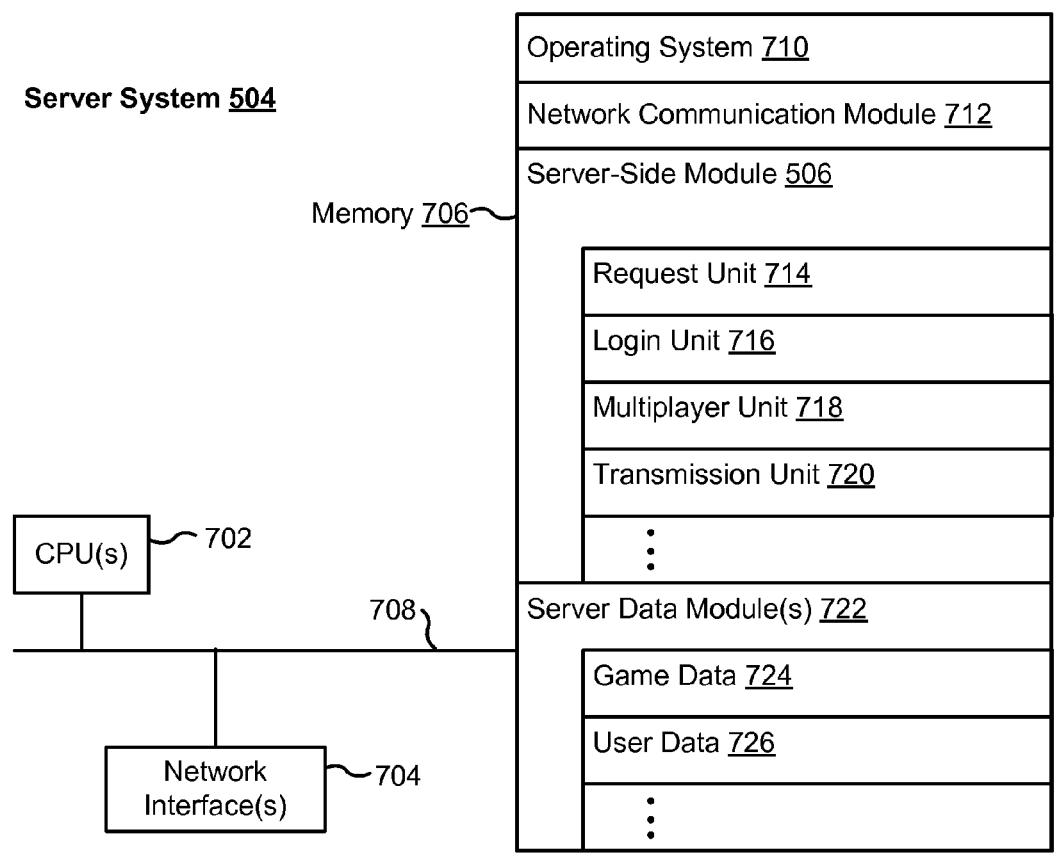
FIG. 7 is a block diagram of a server system in accordance with some embodiments.

FIG. 7 is a block diagram illustrating server system 504 in accordance with some embodiments. Server system 504, typically, includes one or more processing units (CPUs) 702, one or more network interfaces 704, memory 706, and one or more communication buses 708 for interconnecting these components (sometimes called a chipset). Memory 706 includes high-speed random access memory, such as DRAM, SRAM, DDR RAM, or other random access solid state memory devices; and, optionally, includes non-volatile memory, such as one or more magnetic disk storage devices, optical disk storage devices, flash memory devices, or other non-volatile solid state storage devices. Memory 706, optionally, includes one or more storage devices remotely located from the CPU(s) 702. Memory 706, or alternately the non-volatile memory device(s) within memory 706, includes a non-transitory computer readable storage medium. In some implementations, memory 706, or the non-transitory computer readable storage medium of memory 706, stores the following programs, modules, and data structures, or a subset or superset hereof:

an operating system 710 including procedures for handling various basic system services and for performing hardware dependent tasks;
a network communication module 712 that is used for connecting server system 504 to other computing devices (e.g., client devices 502) connected to one or more networks 510 via one or more network interfaces 704 (wired or wireless);
a server-side module 506 for performing data processing for a respective application or game, including but not limited to:
a request unit 714 for receiving requests from a client device 502;
a login unit 716 for authenticating user credentials for game play;
an multiplayer unit 718 for enabling multiple players to play a same game session; and
a transmission unit 720 for sending data to a client device 502;
one or more server data modules 722 for storing data related to server system 504, including but not limited to:
game data 724 with information for rendering and executing the game; and
user data 726 for storing data associated with users playing the game.

Each of the above identified elements may be stored in one or more of the previously mentioned memory devices, and corresponds to a set of instructions for performing a function described above. The above identified modules or programs (i.e., sets of instructions) need not be implemented as separate software programs, procedures, or modules, and thus various subsets of these modules may be combined or otherwise re-arranged in various implementations. In some implementations, memory 706, optionally, stores a subset of the modules and data structures identified above. Furthermore, memory 706, optionally, stores additional modules and data structures not described above.

Although FIGS. 6-7 shows client device 502 and server system 504, respectively, FIGS. 6-7 are intended more as functional description of the various features which may be present in a set of servers than as a structural schematic of the implementations described herein. In practice, and as recognized by those of ordinary skill in the art, items shown separately could be combined and some items could be separated. For example, some items shown separately in FIGS. 6-7 could be implemented on a single server and single items could be implemented by one or more servers. For example, the actual number of servers used to implement server system 504 and how features are allocated among them will vary from one implementation to another.

While particular embodiments are described above, it will be understood it is not intended to limit the invention to these particular embodiments. On the contrary, the invention includes alternatives, modifications and equivalents that are within the spirit and scope of the appended claims. Numerous specific details are set forth in order to provide a thorough understanding of the subject matter presented herein. But it will be apparent to one of ordinary skill in the art that the subject matter may be practiced without these specific details. In other instances, well-known methods, procedures, components, and circuits have not been described in detail so as not to unnecessarily obscure aspects of the embodiments.

What is claimed is:
1. A method of adjusting audio delivery in an application, comprising:
at a client side device with one or more processors and memory:
while executing the application:
identifying an action mode of a user of the client device in the application, wherein the action mode is a confrontation mode;

detecting an event in the action mode, further including:
  obtaining a hostility metric associated with a party other than the user in the confrontation mode;
  in accordance with a determination that the hostility metric associated with the party exceeds a predetermined confrontation threshold:
    determining that a confrontation event has occurred;
    reading an audio file associated with the confrontation event and
    decreasing a current volume associated with background music for the application and increasing a default volume of the audio file associated with the confrontation event for immediate playback in the application based on the confrontation event;
  adjusting an audio mixing mode for sound effects in the application based on the action mode and the event.

2. The method of claim 1, wherein adjusting the audio mixing mode for the sound effects further comprises adjusting a default volume of audio associated with the event and a current volume of background music for the application for immediate playback in the application.

3. The method of claim 2, further comprising:
  determining whether the event is complete; and
  in accordance with a determination that the event is complete, adjusting the volume of the background music for the application.

4. The method of claim 1, further comprising:
  detecting an emergency event in the confrontation mode; and
  in response to detecting the emergency event:
    reading an audio file associated with the emergency event; and
    based on the emergency event, further decreasing the current volume associated with the background music for the application, decreasing a current volume associated with the confrontation event, and increasing a default volume of the audio file associated with the emergency event for immediate playback in the application.

5. The method of claim 4, wherein detecting the emergency event comprises:
  obtaining an operating state of the user; and
  detecting the emergency event in accordance with a determination that the operating state of the user is below a predetermined operating threshold.

6. The method of claim 1, wherein the action mode is a task execution mode, and wherein detecting the event in the action mode comprises:
  determining whether a task event in the task execution mode has occurred;
  in accordance with a determination that the task event in the task execution mode has occurred:
    reading an audio file associated with the task event; and
    based on the task event, decreasing a current volume associated with the background music for the application and increasing a default volume of the audio file associated with the task event for immediate playback in the application.

7. A client device, comprising:
  one or more processors; and
  memory storing one or more programs to be executed by the one or more processors, the one or more programs comprising instructions for:
    while executing the application:
      identifying an action mode of a user of the client device in the application, wherein the action mode is a confrontation mode;
      detecting an event in the action mode, further including:
        obtaining a hostility metric associated with a party other than the user in the confrontation mode;
        in accordance with a determination that the hostility metric associated with the party exceeds a predetermined confrontation threshold:
          determining that a confrontation event has occurred;
          reading an audio file associated with the confrontation event and
          decreasing a current volume associated with background music for the application and increasing a default volume of the audio file associated with the confrontation event for immediate playback in the application based on the confrontation event;
        adjusting an audio mixing mode for sound effects in the application based on the action mode and the event.

8. The client device of claim 7, wherein adjusting the audio mixing mode for the sound effects further comprises adjusting a default volume of audio associated with the event and a current volume of background music for the application for immediate playback in the application.

9. The client device of claim 8, wherein the one or more programs further comprise instructions for:
  determining whether the event is complete; and
  in accordance with a determination that the event is complete, adjusting the volume of the background music for the application.

10. The client device of claim 7, wherein the one or more programs further comprise instructions for:
  detecting an emergency event in the confrontation mode; and
  in response to detecting the emergency event:
    reading an audio file associated with the emergency event; and
    based on the emergency event, further decreasing the current volume associated with the background music for the application, decreasing a current volume associated with the confrontation event, and increasing a default volume of the audio file associated with the emergency event for immediate playback in the application.

11. The client device of claim 10, wherein detecting the emergency event comprises:
  obtaining an operating state of the user; and
  detecting the emergency event in accordance with a determination that the operating state of the user is below a predetermined operating threshold.

12. The client device of claim 7, wherein the action mode is a task execution mode, and wherein detecting the event in the action mode comprises:
  determining whether a task event in the task execution mode has occurred;
  in accordance with a determination that the task event in the task execution mode has occurred:
    reading an audio file associated with the task event; and
    based on the task event, decreasing a current volume associated with the background music for the application and increasing a default volume of the audio file associated with the task event for immediate playback in the application.

13. A non-transitory computer readable storage medium storing one or more programs, the one or more programs comprising instructions, which, when executed by a client device with one or more processors, cause the client device to perform operations comprising:
  while executing the application:
    identifying an action mode of a user of the client device in the application, wherein the action mode is a confrontation mode;
    detecting an event in the action mode, further including:
      obtaining a hostility metric associated with a party other than the user in the confrontation mode;
      in accordance with a determination that the hostility metric associated with the party exceeds a predetermined confrontation threshold:
        determining that a confrontation event has occurred;
        reading an audio file associated with the confrontation event; and
        decreasing a current volume associated with background music for the application and increasing a default volume of the audio file associated with the confrontation event for immediate playback in the application based on the confrontation event;
    adjusting an audio mixing mode for sound effects in the application based on the action mode and the event.

14. The non-transitory computer-readable storage medium of claim 13, wherein adjusting the audio mixing mode for the sound effects further comprises adjusting a default volume of audio associated with the event and a current volume of background music for the application for immediate playback in the application.

15. The non-transitory computer readable storage medium of claim 13, wherein the instructions cause the client device to perform operations further comprising:
  detecting an emergency event in the confrontation mode; and
  in response to detecting the emergency event:
    reading an audio file associated with the emergency event; and
    based on the emergency event, further decreasing the current volume associated with the background music for the application, decreasing a current volume associated with the confrontation event, and increasing a default volume of the audio file associated with the emergency event for immediate playback in the application.

16. The non-transitory computer readable storage medium of claim 15, wherein detecting the emergency event comprises:
  obtaining an operating state of the user; and
  detecting the emergency event in accordance with a determination that the operating state of the user is below a predetermined operating threshold.

17. The non-transitory computer readable storage medium of claim 13, wherein the action mode is a task execution mode, and wherein detecting the event in the action mode comprises:
  determining whether a task event in the task execution mode has occurred;
  in accordance with a determination that the task event in the task execution mode has occurred:
    reading an audio file associated with the task event; and
    based on the task event, decreasing a current volume associated with the background music for the application and increasing a default volume of the audio file associated with the task event for immediate playback in the application.

* * * * *